(12) United States Patent
Fan

(10) Patent No.: US 10,170,034 B2
(45) Date of Patent: Jan. 1, 2019

(54) GRAPHENE DISPLAY, A DRIVING METHOD FOR A GRAPHENE DISPLAY AND A DRIVING APPARATUS

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Co., Ltd, Shenzhen, Guangdong (CN)

( * ) Notice: Subject to any disclaimer, the term of this patent is extended or adjusted under 35 U.S.C. 154(b) by 266 days.

(21) Appl. No.: 15/108,297

(22) PCT Filed: Jun. 12, 2016

(86) PCT No.: PCT/CN2016/085464
§ 371 (c)(1),
(2) Date: Jun. 25, 2016

(87) PCT Pub. No.: WO2017/197677
PCT Pub. Date: Nov. 23, 2017

(65) Prior Publication Data
US 2018/0102087 A1 Apr. 12, 2018

(30) Foreign Application Priority Data
May 18, 2016 (CN) .......................... 2016 1 0334783

(51) Int. Cl.
*G09G 3/32* (2016.01)
*G09G 3/36* (2006.01)
*H01L 29/16* (2006.01)

(52) U.S. Cl.
CPC ............... *G09G 3/32* (2013.01); *G09G 3/36* (2013.01); *H01L 29/1606* (2013.01); *G09G 2300/0465* (2013.01); *G09G 2320/0666* (2013.01)

(58) Field of Classification Search
CPC .................................................... G09G 3/3607
See application file for complete search history.

(56) References Cited

U.S. PATENT DOCUMENTS

| | | |
|---|---|---|
| 7,557,952 B2 | 7/2009 | Tsukada |
| 8,542,244 B2 | 9/2013 | Kempf et al. |
| 2006/0038953 A1 | 2/2006 | Moriya |
| 2013/0063470 A1 | 3/2013 | Kempf et al. |

(Continued)

*Primary Examiner* — Robin Mishler
(74) *Attorney, Agent, or Firm* — Andrew C. Cheng

(57) ABSTRACT

The present application discloses a graphene display, and a driving method and a driving apparatus for a graphene display, the driving apparatus for a graphene display includes obtaining the grayscale values of the three primary colors of the pixel to be input; determining the color and grayscale values of three dynamic sub-pixels according to the grayscale values of the three primary colors of the pixel and the correspondence relationship of the preset grayscale values of the three primary colors and the grayscale values of the five primary colors; applying the driving voltages to the three dynamic sub-pixels respectively corresponding to the color and grayscale values of three dynamic sub-pixels. By the method described above, the gamut of the display is increased, to increase the display performance of the display and decrease the power consumption of the display.

18 Claims, 5 Drawing Sheets

(56) References Cited

U.S. PATENT DOCUMENTS

| | | | |
|---|---|---|---|
| 2014/0253422 A1* | 9/2014 | Tomizawa | G02F 1/133514 345/88 |
| 2016/0343281 A1 | 11/2016 | Fan | |
| 2017/0256679 A1 | 9/2017 | Fan | |

* cited by examiner

GRAPHENE DISPLAY, A DRIVING METHOD FOR A GRAPHENE DISPLAY AND A DRIVING APPARATUS

FIELD OF THE INVENTION

The present application relates to a display technology field, and more particularly to a graphene display, a driving method for a graphene display and a driving apparatus.

BACKGROUND OF THE INVENTION

With the popularity of liquid crystal display and the continuous growing market, in many choices, the requirements of the users to the liquid crystal display devices are increased. For the conventional display, even the RGB three-color display with high color saturation, or even RGBY four primary monitors cannot meet the user's requirements for the color gamut coverage of the display.

In recent years, since the invention of the graphene light-emitting element, makes the graphene applications in the display area to be enlarged extension. Graphene has a hard, high transparency (transmittance ≈97.7%), high thermal conductivity (up to 5300 W/m·K), the high electron mobility rate (more than 15000 cm2/V·s), and other great properties. The applications in display are gradually increased in recent years, especially in the application of touch screen (as an alternative to the conventional transparent conductive film, ITO) and applications in LED area. By theoretical calculation, the color gamut of the graphene can reach 158%. But in the conventional technology, there is no method of how to achieve the high color gamut coverage.

SUMMARY OF THE INVENTION

The present application discloses a graphene display, and a driving method and a driving apparatus for a graphene display to increase the gamut of the display, to increase the display performance of the display and decrease the power consumption of the display.

In other to solve the technology problem described above, a technology approach provided in the present application is: providing a graphene display wherein the graphene display includes a display panel and a driving apparatus electrically connected to the display panel, the display panel includes a plurality of pixels distributed in array type and each of the pixel includes three dynamic sub-pixels; wherein the driving apparatus includes: an obtaining module to obtaining the grayscale values of the three primary colors of the pixel to be input; a determination module to determining the color and grayscale values of three dynamic sub-pixels according to the grayscale values of the three primary colors of the pixel and the correspondence relationship of the preset grayscale values of the three primary colors and the grayscale values of the five primary colors; and a driving module to apply the driving voltages to the three dynamic sub-pixels respectively corresponding to the color and grayscale values of three dynamic sub-pixels.

Wherein the three primary colors are red, green, blue and the five primary colors are red, green, blue, yellow, cyan.

Wherein the determination module is also configured to: according to the grayscale values of the three primary colors to determine the color block of the target color point of the pixel in the color gamut, wherein the color gamut includes the five color blocks corresponding to each of the five primary colors; and according to the color block of the target color point of the pixel in the color gamut, to determine the color and grayscale values of three dynamic sub-pixel.

Wherein the determination module is further configured to: by the grayscale value of the red, green, and blue $R_i$, $G_i$, $B_i$ to obtain the maximum value $a=\max(R_i, G_i, B_i)$ and a minimum value $b=\min(R_i, G_i, B_i)$ after calculation; If $b=G_i$ or $a=b$, it can be determined that the target color point of the pixel in the color gamut fall into the WRB block; If $b=R_i$ and $a\neq B_i$, it can be determined that the target color point of the pixel in the color gamut fall into the WGC block; If $b=B_i$ or $a=G_i$, it can be determined that the target color point of the pixel in the color gamut fall into the WCB block; If $b\neq R_i$ and $a=G_i$, it can be determined that the target color point of the pixel in the color gamut fall into the WYG block; and If $b\neq R_i$ and $a\neq G_i$, it can be determined that the target color point of the pixel in the color gamut fall into the WRY block.

Wherein the determination module is further configured to: when the target color point of the pixel in the color gamut fall into the WRB block, the grayscale values of the three dynamic sub-pixel is determined to be $R_{gi}=R_i$, $G_{gi}=G_i$, $B_{gi}=B_i$; when the target color point of the pixel in the color gamut fall into the WGC block, the grayscale values of the three dynamic sub-pixel is determined to be $R_{gi}=R_i$, $G_{gi}=G_i-B_i$, $C_{gi}=B_i$; when the target color point of the pixel in the color gamut fall into the WCB block, the grayscale values of the three dynamic sub-pixel is determined to be $R_{gi}=R_i$, $C_{gi}=G_i-R_i$, $B_{gi}=B_i$; when the target color point of the pixel in the color gamut fall into the WYG block, the grayscale values of the three dynamic sub-pixel is determined to be $Y_{gi}=R_i$, $G_{gi}=G_i-R_i$, $B_{gi}=B_i$; when the target color point of the pixel in the color gamut fall into the WRY block, the grayscale values of the three dynamic sub-pixel is determined to be $R_{gi}=R_i-G_i$, $Y_{gi}=G_i$, $B_{gi}=B_i$; wherein, $R_{gi}$, $G_{gi}$, $B_{gi}$, $Y_{gi}$, $C_{gi}$ respected the grayscale values of the red, green, blue, yellow, cyan as five primary colors.

Wherein the driving apparatus further includes a color gamut determination module to establish the five primary colors in the color gamut; and divided the color gamut into five color blocks of WRB, WGC, WCB, WYG and WRY.

In other to solve the technology problem described above, another technology approach adapted in the present application is providing a driving method for a graphene display, wherein each pixel of the graphene display includes three dynamic sub-pixels, the driving method includes: obtaining the grayscale values of the three primary colors of the pixel to be input; determining the color and grayscale values of three dynamic sub-pixels according to the grayscale values of the three primary colors of the pixel and the correspondence relationship of the preset grayscale values of the three primary colors and the grayscale values of the five primary colors; applying the driving voltages to the three dynamic sub-pixels respectively corresponding to the color and grayscale values of three dynamic sub-pixels.

Wherein the three primary colors are red, green, blue and the five primary colors are red, green, blue, yellow, cyan.

Wherein the determining the color and grayscale values of three dynamic sub-pixels according to the grayscale values of the three primary colors of the pixel and the correspondence relationship of the preset grayscale values of the three primary colors and the grayscale values of the five primary colors, includes: according to the grayscale values of the three primary colors to determine the color block of the target color point of the pixel in the color gamut, wherein the color gamut includes the five color blocks corresponding to each of the five primary colors; and according to the color block of the target color point of the pixel in the color gamut, to determine the color and grayscale values of three dynamic sub-pixel.

Wherein according to the color block of the target color point of the pixel in the color gamut, to determine the color and grayscale values of three dynamic sub-pixel, includes: by the grayscale value of the red, green, and blue $R_i$, $G_i$, $B_i$ to obtain the maximum value a=max $(R_i, G_i, B_i)$ and a minimum value b=min $(R_i, G_i, B_i)$ after calculation; If b=Gi or a=b, it can be determined that the target color point of the pixel in the color gamut fall into the WRB block; If b=$R_i$ and a≠$B_i$, it can be determined that the target color point of the pixel in the color gamut fall into the WGC block; If b=$R_i$ or a=$B_i$, it can be determined that the target color point of the pixel in the color gamut fall into the WCB block; If b≠$R_i$ and a=$G_i$, it can be determined that the target color point of the pixel in the color gamut fall into the WYG block; and If b≠$R_i$ and a≠$G_i$, it can be determined that the target color point of the pixel in the color gamut fall into the WRY block.

Wherein according to the color block of the target color point of the pixel in the color gamut, to determine the color and grayscale values of three dynamic sub-pixel, includes: when the target color point of the pixel in the color gamut fall into the WRB block, the grayscale values of the three dynamic sub-pixel is determined to be $R_{gi}=R_i$, $G_{gi}=G_i$, $B_{gi}=B_i$; when the target color point of the pixel in the color gamut fall into the WGC block, the grayscale values of the three dynamic sub-pixel is determined to be $R_{gi}=R_i$, $G_{gi}=G_i-B_i$, $C_{gi}=B_i$; when the target color point of the pixel in the color gamut fall into the WCB block, the grayscale values of the three dynamic sub-pixel is determined to be $R_{gi}=R_i$, $C_{gi}=G_i-R_i$, $B_{gi}=B_i$; when the target color point of the pixel in the color gamut fall into the WYG block, the grayscale values of the three dynamic sub-pixel is determined to be $Y_{gi}=R_i$, $G_{gi}=G_i-R_i$, $B_{gi}=B_i$; when the target color point of the pixel in the color gamut fall into the WRY block, the grayscale values of the three dynamic sub-pixel is determined to be $R_{gi}=R_i-G_i$, $Y_{gi}=G_i$, $B_{gi}=B_i$; wherein, $R_{gi}$, $G_{gi}$, $B_{gi}$, $Y_{gi}$, $C_{gi}$ respected the grayscale values of the red, green, blue, yellow, cyan as five primary colors.

Wherein the driving method further includes establish the five primary colors in the color gamut; and divided the color gamut into five color blocks of WRB, WGC, WCB, WYG and WRY.

In other to solve the technology problem described above, a technology approach provided in the present application is providing a driving apparatus for a graphene display, includes: an obtaining module to obtaining the grayscale values of the three primary colors of the pixel to be input; a determination module to determining the color and grayscale values of three dynamic sub-pixels according to the grayscale values of the three primary colors of the pixel and the correspondence relationship of the preset grayscale values of the three primary colors and the grayscale values of the five primary colors; a driving module to apply the driving voltages to the three dynamic sub-pixels respectively corresponding to the color and grayscale values of three dynamic sub-pixels.

Wherein the three primary colors are red, green, blue and the five primary colors are red, green, blue, yellow, cyan.

Wherein the determination module is also configured to: according to the grayscale values of the three primary colors to determine the color block of the target color point of the pixel in the color gamut, wherein the color gamut includes the five color blocks corresponding to each of the five primary colors; and according to the color block of the target color point of the pixel in the color gamut, to determine the color and grayscale values of three dynamic sub-pixel.

Wherein the determination module is further configured to: by the grayscale value of the red, green, and blue $R_i$, $G_i$, $B_i$ to obtain the maximum value a=max $(R_i, G_i, B_i)$ and a minimum value b=min $(R_i, G_i, B_i)$ after calculation; If b=Gi or a=b, it can be determined that the target color point of the pixel in the color gamut fall into the WRB block; If b=$R_i$ and a≠$B_i$, it can be determined that the target color point of the pixel in the color gamut fall into the WGC block; If b=$R_i$ or a=$B_i$, it can be determined that the target color point of the pixel in the color gamut fall into the WCB block; If b≠$R_i$ and a=$G_i$, it can be determined that the target color point of the pixel in the color gamut fall into the WYG block; and If b≠$R_i$ and a≠$G_i$, it can be determined that the target color point of the pixel in the color gamut fall into the WRY block.

Wherein the determination module is further configured to: when the target color point of the pixel in the color gamut fall into the WRB block, the grayscale values of the three dynamic sub-pixel is determined to be $R_{gi}=R_i$, $G_{gi}=G_i$, $B_{gi}=B_i$; when the target color point of the pixel in the color gamut fall into the WGC block, the grayscale values of the three dynamic sub-pixel is determined to be $R_{gi}=R_i$, $G_{gi}=G_i-B_i$, $C_{gi}=B_i$; when the target color point of the pixel in the color gamut fall into the WCB block, the grayscale values of the three dynamic sub-pixel is determined to be $R_{gi}=R_i$, $C_{gi}=G_i-$, $R_i$, $B_{gi}=B_i$; when the target color point of the pixel in the color gamut fall into the WYG block, the grayscale values of the three dynamic sub-pixel is determined to be $Y_{gi}=R_i$, $G_{gi}=G_i-R_i$, $B_{gi}=B_i$; when the target color point of the pixel in the color gamut fall into the WRY block, the grayscale values of the three dynamic sub-pixel is determined to be $R_{gi}=R_i-G_i$, $Y_{gi}=G_i$, $B_{gi}=B_i$; wherein, $R_{gi}$, $G_{gi}$, $B_{gi}$, $Y_{gi}$, $C_{gi}$ respected the grayscale values of the red, green, blue, yellow, cyan as five primary colors.

Wherein the driving apparatus further includes a color gamut determination module to establish the five primary colors in the color gamut; and divided the color gamut into five color blocks of WRB, WGC, WCB, WYG and WRY.

The advantage of the present application is, distinguished from the conventional technology, the driving method of the graphene display of this embodiment includes: obtain the grayscale values of the three primary colors of the pixel to be input; determining the color and grayscale values of three dynamic sub-pixels according to the grayscale values of the three primary colors of the pixel and the correspondence relationship of the preset grayscale values of the three primary colors and the grayscale values of the five primary colors; the driving voltages are applied to the three dynamic sub-pixels respectively corresponding to the color and grayscale values of three dynamic sub-pixels. By the above-described embodiment, not only to achieve more than 142% color gamut display in graphene displays, that is far more than the color gamut in any display can be achieved, and it can completely cover the range of the color gamut of existing real object. And it can be realized the high color fidelity, which greatly enhance the display quality of the display. In addition, due to the increased color gamut of the display can also increase the aperture ratio, thereby reducing the power consumption of the display.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

FIG. 1 is a schematic view of the structure of the graphene display of one embodiment of the present application.

DETAILED DESCRIPTION OF PREFERRED EMBODIMENTS

Embodiments of the present application are described in detail with the technical matters, structural features, achieved objects, and effects with reference to the accompanying drawings as follows. it is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 1:
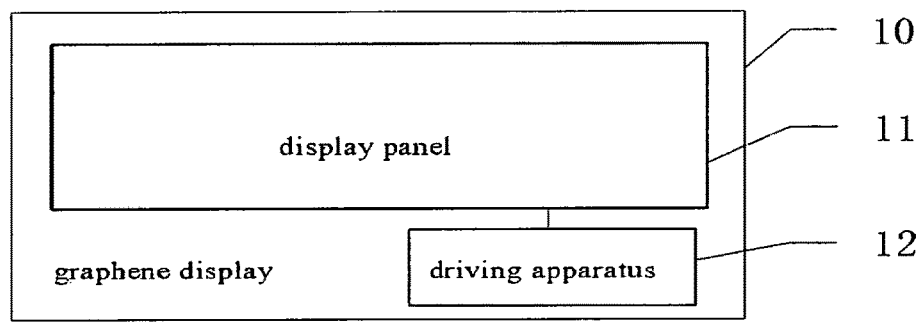

Referring to FIG. 1, FIG. 1 is a schematic view of the structure of the graphene display of one embodiment of the present application. The graphene display 10 includes a display panel 11 and a driving apparatus 12 electrically connected to the display panel 11.

Figure 2:
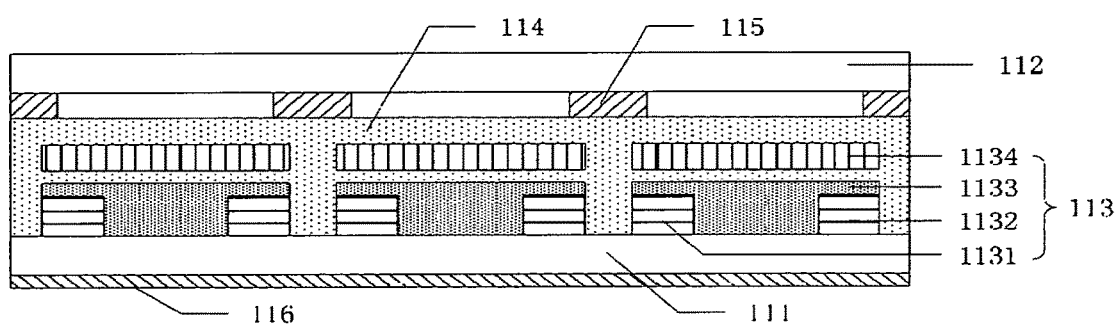
FIG. 2 is a schematic view of the structure of the display panel of the graphene display of one embodiment of the present application.

Wherein, referring to FIG. 2, the display panel 11 includes a lower substrate 111, an upper substrate 112 and a light emitting means 113 distributed in array type and disposed between the lower substrate 111 and the upper substrate 112. The light emitting means 113 is operable under the action of the driving apparatus 12 to make the display of the graphene display 10.

The light emitting means 113 includes a source electrode 1131, and a drain electrode 1132 disposed on the lower substrate. A groove is formed to space the source electrode 1131 and the drain electrode 1132 apart. And a light emitting layer 1133 is formed on the source electrode 1131, the drain electrode 1132 and the groove. A gate electrode 1134 is formed on the light emitting layer 1133.

Specifically, the source electrode 1131 and the drain electrodes 1132 are reduced graphene oxide, the light-emitting layer 1133 is semi-reduced graphene oxide, the gate electrode 1134 is graphene oxide. The material of the lower substrate 111 is selected form at least one of a transparent organic material to barrier water and oxygen (pet), glass, and nickel. the material of the upper substrate 112 selected form at least one of an organic material to barrier water and oxygen (PET), or glass.

Optionally, the display panel 11 further includes a protective layer 114 covered on the light emitting means 113 and a black matrix layer 115 disposed on the protective layer 114.

Optionally, the display panel 11 further includes a reflective layer 116 disposed on a side of the lower substrate 111 away from the light emitting means 113. Wherein, the reflective layer 116 can be a metal reflective layer with high reflectivity.

It could be understood that the light-emitting means 113 is formed a dynamic sub-pixel, three light-emitting means 113 formed a pixel.

For a dynamic sub-pixel graphene of the dynamic display sub-pixel, the different of the gate voltage will emit different colors of light, for example, when the gate voltage is 0~10V, the source-drain voltage Vds>threshold voltage Vth. In this time, the dynamic sub-pixel emits red light; when the gate voltage is 20~30V, the source-drain voltage Vds>threshold voltage Vth. In this time, the dynamic sub-pixel emits green light when the gate voltage is 40~50V, the source-drain voltage Vds>threshold voltage Vth. In this time, the dynamic sub-pixel emits blue light. Thus, by varying the driving voltage to change the color display of graphene, is grayscale adjustment.

In particular, the specific structure and the driving method of the driving apparatus 12 can refer to the following embodiments.

Figure 3:
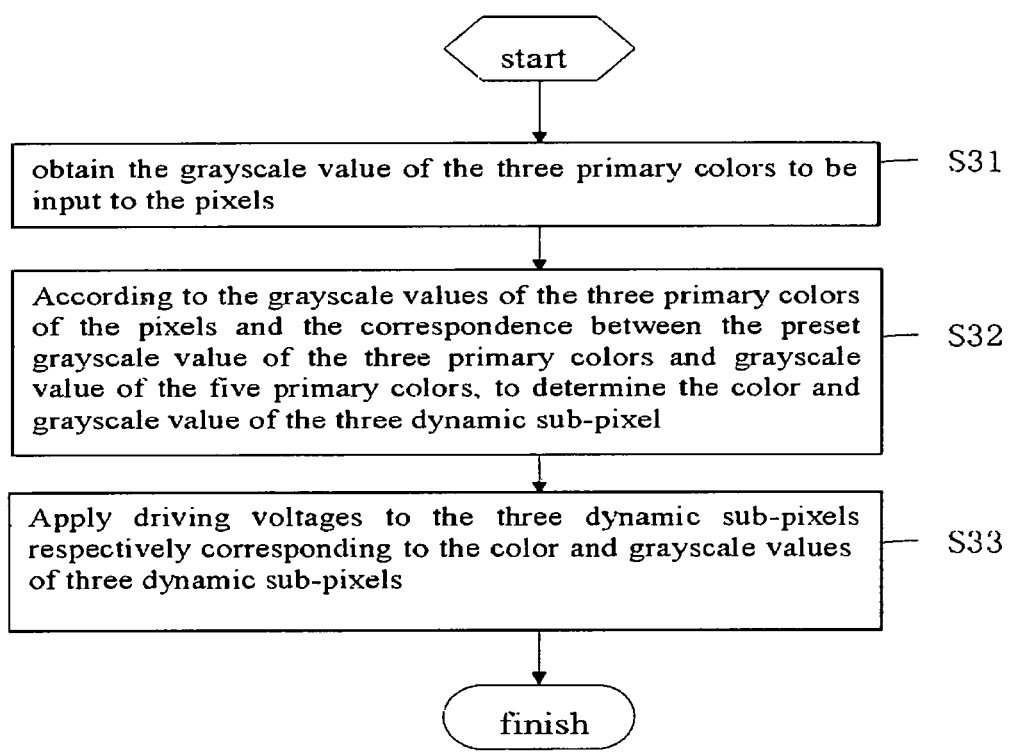
FIG. 3 shows the flow of the driving method of the graphene display of one embodiment of the present application.

Referring to FIG. 3, FIG. 3 shows the flow of the driving method of the graphene display of one embodiment of the present application, the driving method including:

S31: obtain the grayscale value of the three primary colors to be input to the pixels. Wherein the three primary colors can be red, green, and blue colors, such commonly referred to RGB. In other embodiments, it can also be other colors, such as red, green, yellow.

Specifically, the grayscale value of the three primary colors can be obtained by receiving from the image signal, it can be obtained from scanning or shooting, etc. The grayscale value is usually 0-255, and of 256 values. Take RGB for example, the value of R is 122, the value of G is 156, and the value of B is 225. Of course, in other embodiments, the grayscale value can also be replaced by gray level value, i.e., gray level value is the ratio of the grayscale value and the maximum of the grayscale value of 255.

S32: According to the grayscale values of the three primary colors of the pixels and the correspondence between the preset grayscale value of the three primary colors and grayscale value of the five primary colors, to determine the color and grayscale value of the three dynamic sub-pixel.

Wherein, in one embodiment, the five primary colors are red, green, blue, yellow, cyan.

Specifically, since one pixel includes three dynamic sub-pixels, therefore, one pixel still displays three colors or the combination color by the three colors. So it need to choose three colors from the five primary colors to display in the three dynamic sub-pixel, the specific selection method and the pixel value can be based on the correspondence between the preset grayscale value of the three primary colors and grayscale value of the five primary colors.

For example, when grayscale value of the red, green, and blue in the three primary colors satisfies a preset first condition, the three dynamic sub-pixel still display the red, green, and blue color; when grayscale value of the red, green, and blue in the three primary colors satisfies a preset second condition, the three dynamic sub-pixel still display the red, green, and yellow color; wherein the grayscale value of yellow can be calculated according to the grayscale value of the red, green, and blue in the three primary colors. Therefore, by using the grayscale value of the red, green, and blue in the three primary color, and display in five primary colors, the color gamut is greatly increased.

Here, a specific embodiment is used to illustrate the step S32.

In another embodiment, S32 includes:

S321: According to the grayscale value of the three primary color of the pixel, to determine color block of the target color point of the pixel in the color gamut, wherein the color gamut includes the five color blocks corresponding to each of the five primary colors.

Figure 4:
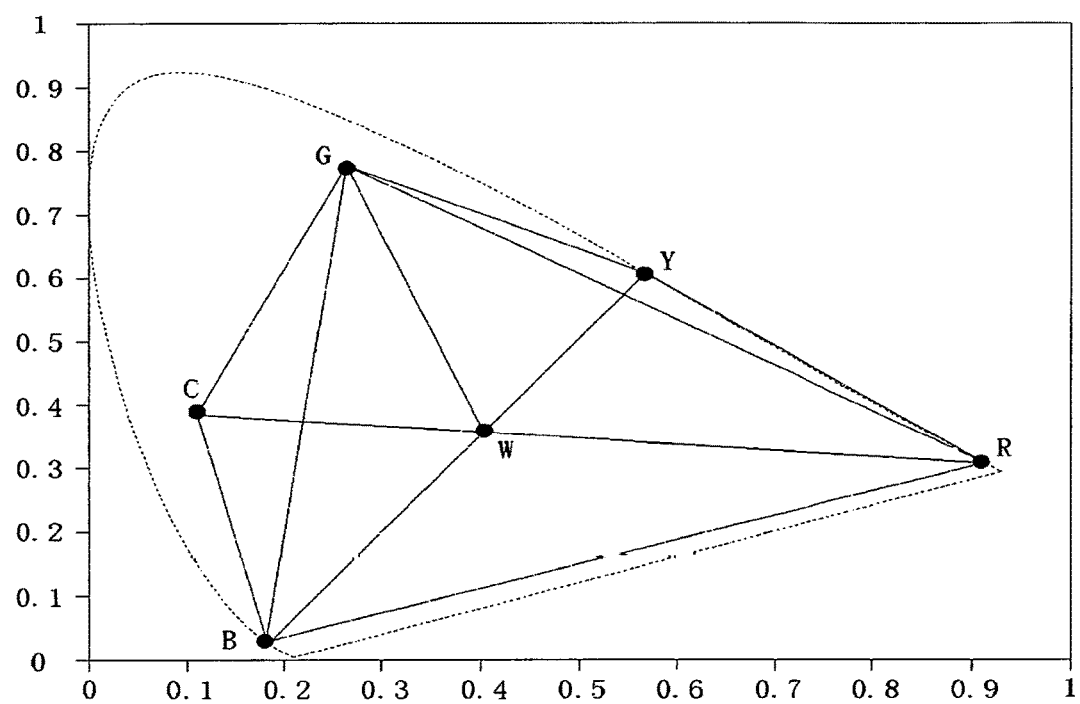
FIG. 4 is a schematic diagram illustrating the chromaticity diagram of the graphene display of one embodiment of the present application.

As illustrated in FIG. 4, in order to establish the color gamut by the five primary colors, the color gamut is divided into five color blocks of WRB, WGC, WCB, WYG, WRY. Alternatively, in order to make the color transition of each color block and the entire gamut region more smoothly. The uniform color coordinate system is adapted in the present embodiment, such as the uniform color coordinate of CIE1976, etc., and is not limited by this. Wherein the dotted line represents the range of the Pointer's gamut in the color gamut.

Specifically, the coordinate of the target color point of the pixel in the color gamut can be calculated by the grayscale value of the three primary color of the pixel. The coordinates can be calculated by the conventional algorithm in the three primary color gamut coordinates, where not repeat them.

Alternatively, the following describes a method that is by input the RGB values to determine the color block of the target color point of the pixel in the color gamut.

Be input the grayscale value of the red, green, and blue $R_i$, $G_i$, $B_i$ and obtain the maximum value $a=\max(R_i, G_i, B_i)$ and a minimum value $b=\min(R_i, G_i, B_i)$ after calculation.

If $b=G_i$ or $a=b$, it can be determined that the target color point of the pixel in the color gamut fall into the WRB block. If $b=R_i$ and $a\neq B_i$, it can be determined that the target color point of the pixel in the color gamut fall into the WGC block. If $b=R_i$ and $a=B_i$, it can be determined that the target color point of the pixel in the color gamut fall into the WCB block. If $b\neq R_i$ and $a=G_i$, it can be determined that the target color point of the pixel in the color gamut fall into the WYG block. If $b\neq R_i$ and $a\neq G_i$, it can be determined that the target color point of the pixel in the color gamut fall into the WRY block.

S322: According to the color block of the target color point of the pixel in the color gamut, to determine the color and grayscale values of three dynamic sub-pixel.

Alternatively, if the target color point of the pixel in the color gamut fall into the WRB block, $R_{gi}=R_i$, $G_{gi}=G_i$, $B_{gi}=B_i$; if the target color point of the pixel in the color gamut fall into the WGC block, $R_{gi}=R_i$, $G_{gi}=G_i-B_i$, $C_{gi}=B_i$; if the target color point of the pixel in the color gamut fall into the WCB block, $R_{gi}=R_i$, $C_{gi}=G_i-R_i$, $B_{gi}=B_i$; if the target color point of the pixel in the color gamut fall into the WYG block, $Y_{gi}=R_i$, $G_{gi}=G_i-R_i$, $B_{gi}=B_i$; if the target color point of the pixel in the color gamut fall into the WRY block, $R_{gi}=R_i-G_i$, $Y_{gi}=G_i$, $B_{gi}=B_i$; wherein, $R_{gi}$, $G_{gi}$, $B_{gi}$, $Y_{gi}$, $C_{gi}$ respected the grayscale values of the red, green, blue, yellow, cyan as five primary colors.

Figure 5:
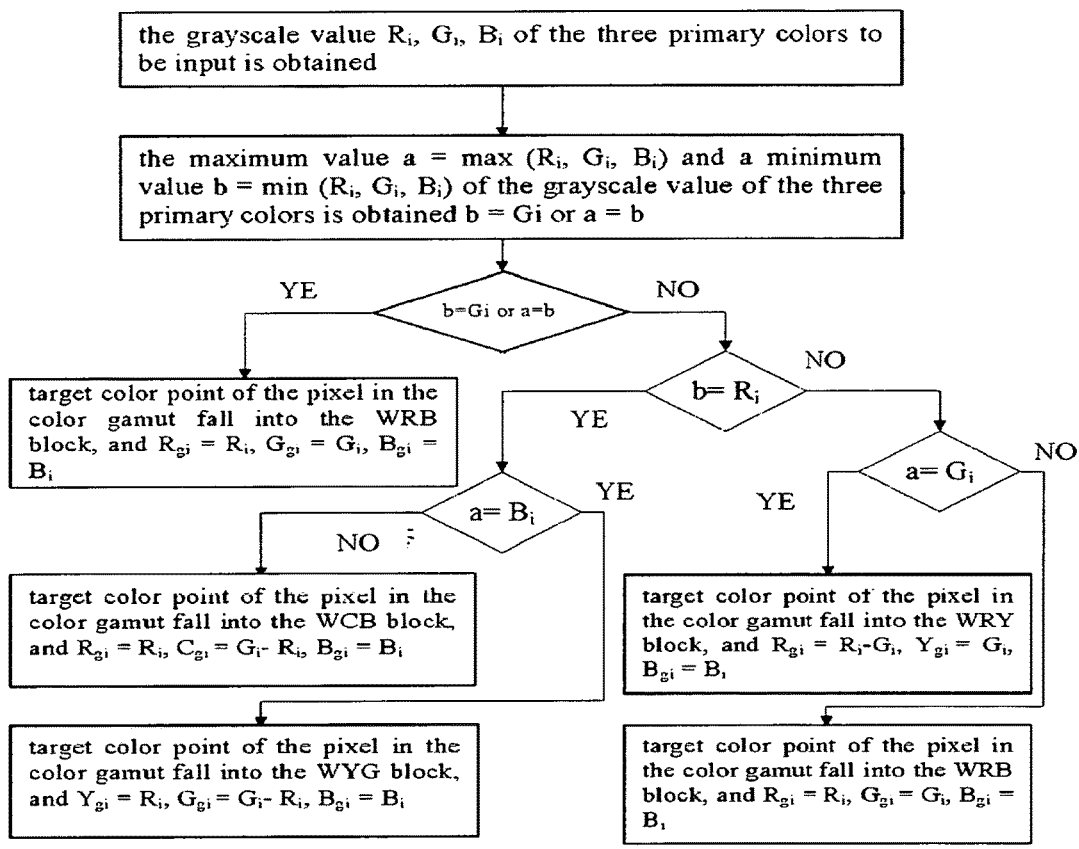
FIG. 5 shows the flow of the driving method of the S32 in the embodiment of the graphene display of one embodiment of the present application.

Alternatively, an alternative embodiment of S32 can be adapted as the process illustrated in FIG. 5, that is similar to the implementation of the principles and the above-described embodiment, no further explanation here.

S33: driving voltages are applied to the three dynamic sub-pixels respectively corresponding to the color and grayscale values of three dynamic sub-pixels.

The present embodiment is described in detail by a specific example described below: It assumed that the grayscale values of red, green, and blue of the pixel to be input is $R_i=89$, $G_i=188$, $B_i=117$, wherein the calculated maximum value $a=188$, the minimum value $b=89$.

Wherein by the principle described above can be obtained, if $b=R_i$ and $a\neq B_i$, it can be determined that the target color point of the pixel in the color gamut fall into the WGC block. That is $R_{gi}=R_i=89$, $G_{gi}=G_i-B_i=71$, $C_{gi}=B_i=117$. That is the three dynamic sub-pixels display tricolor in red, green and cyan respectively, and grayscale value of red is 89, the grayscale value of green is 71, the grayscale value of cyan is 117.

Distinguished from the conventional technology, the driving method of the graphene display of this embodiment includes: obtain the grayscale values of the three primary colors of the pixel to be input; determining the color and grayscale values of three dynamic sub-pixels according to the grayscale values of the three primary colors of the pixel and the correspondence relationship of the preset grayscale values of the three primary colors and the grayscale values of the five primary colors; the driving voltages are applied to the three dynamic sub-pixels respectively corresponding to the color and grayscale values of three dynamic sub-pixels. By the above-described embodiment, not only to achieve more than 142% color gamut display in graphene displays, that is far more than the color gamut in any display can be achieved, and it can completely cover the range of the color gamut of existing real object. And it can be realized the high color fidelity, which greatly enhance the display quality of the display. In addition, due to the increased color gamut of the display can also increase the aperture ratio, thereby reducing the power consumption of the display.

Figure 6:
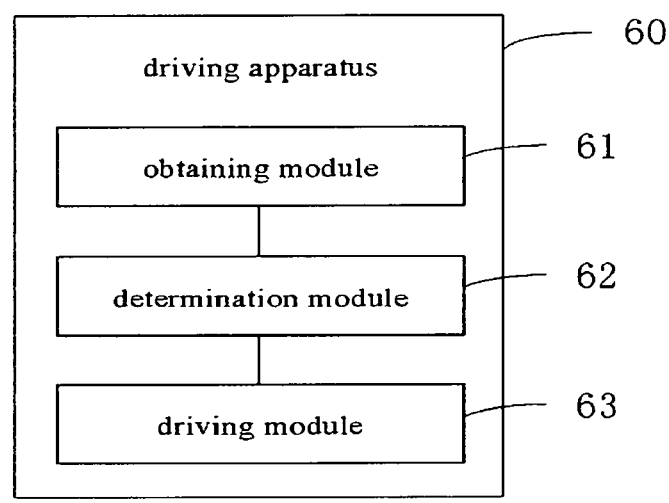
FIG. 6 is a schematic view of the structure of the driving apparatus of the graphene display of one embodiment of the present application.

Referring to FIG. 6, FIG. 6 is a schematic view of the structure of the driving apparatus of the graphene display of one embodiment of the present application. The driving apparatus 60 includes:

An obtaining module 61 to obtaining the grayscale values of the three primary colors of the pixel to be input.

A determination module 62 to determining the color and grayscale values of three dynamic sub-pixels according to the grayscale values of the three primary colors of the pixel and the correspondence relationship of the preset grayscale values of the three primary colors and the grayscale values of the five primary colors.

A driving module 63 to apply the driving voltages to the three dynamic sub-pixels respectively corresponding to the color and grayscale values of three dynamic sub-pixels.

a pixel to be input grayscale value of three primary colors.

Among them, the three primary colors are red, green, blue; the five primary colors are red, green, blue, yellow, cyan.

Alternatively, the determination module 62 is also configured to: according to the grayscale values of the three primary colors to determine the color block of the target color point of the pixel in the color gamut, wherein the color gamut includes the five color blocks corresponding to each of the five primary colors. According to the color block of the target color point of the pixel in the color gamut, to determine the color and grayscale values of three dynamic sub-pixel.

Alternatively, the determination module 62 is further configured to: by the grayscale value of the red, green, and blue $R_i$, $G_i$, $B_i$ to obtain the maximum value a=max ($R_i$, $G_i$, $B_i$) and a minimum value b=min ($R_i$, $G_i$, $B_i$) after calculation. If b=Gi or a=b, it can be determined that the target color point of the pixel in the color gamut fall into the WRB block. If b=$R_i$ and a≠$B_i$, it can be determined that the target color point of the pixel in the color gamut fall into the WGC block. If b=$R_i$ or a=$B_i$, it can be determined that the target color point of the pixel in the color gamut fall into the WCB block. If b≠$R_i$ and a=$G_i$, it can be determined that the target color point of the pixel in the color gamut fall into the WYG block. If b≠$R_i$ and a≠$G_i$, it can be determined that the target color point of the pixel in the color gamut fall into the WRY block.

Alternatively, the determination module 62 is further configured to: when the target color point of the pixel in the color gamut fall into the WRB block, the grayscale values of the three dynamic sub-pixel is determined to be $R_{gi}$=$R_i$, $G_{gi}$=$G_i$, $B_{gi}$=$B_i$; when the target color point of the pixel in the color gamut fall into the WGC block, the grayscale values of the three dynamic sub-pixel is determined to be $R_{gi}$=$R_i$, $G_{gi}$=$G_i$-$B_i$, $C_{gi}$=$B_i$; when the target color point of the pixel in the color gamut fall into the WCB block, the grayscale values of the three dynamic sub-pixel is determined to be $R_{gi}$=$R_i$, $C_{gi}$=$G_i$-$R_i$, $B_{gi}$=$B_i$; when the target color point of the pixel in the color gamut fall into the WYG block, the grayscale values of the three dynamic sub-pixel is determined to be $Y_{gi}$=$R_i$, $G_{gi}$=$G_i$-$R_i$, $B_{gi}$=$B_i$; when the target color point of the pixel in the color gamut fall into the WRY block, the grayscale values of the three dynamic sub-pixel is determined to be $R_{gi}$=$R_i$-$G_i$, $Y_{gi}$=$G_i$, $B_{gi}$=$B_i$; wherein, $R_{gi}$, $G_{gi}$, $B_{gi}$, $Y_{gi}$, $C_{gi}$ respected the grayscale values of the red, green, blue, yellow, cyan as five primary colors.

It can be understood that the driving apparatus of the present embodiment is one embodiment based on the driving method, the implementation principles and steps are similar, and not repeat them here.

Above are embodiments of the present application, which does not limit the scope of the present application. Any modifications, equivalent replacements or improvements within the spirit and principles of the embodiment described above should be covered by the protected scope of the invention.

What is claimed is:

1. A graphene display wherein the graphene display comprising a display panel and a driving apparatus electrically connected to the display panel, the display panel comprising a plurality of pixels distributed in array type and each of the pixels is consisted of three dynamic sub-pixels;
   wherein the driving apparatus comprising:
   an obtaining module to obtaining grayscale values of three primary colors of each of the pixels to be input;
   a determination module to determining adjusted grayscale values of the three dynamic sub-pixels of each of the pixels according to the obtained grayscale values of the three primary colors of each of the pixels and a preset correspondence relationship of the obtained grayscale values of the three primary colors and color blocks determined by five primary colors in color gamut;
   a driving module to apply driving voltages to the three dynamic sub-pixels respectively corresponding to the adjusted grayscale values of the three dynamic sub-pixels of each of the pixels such that each of the pixels uses the three dynamic sub-pixels thereof to display the adjusted grayscale values of the five primary colors in the color gamut.

2. The graphene display according to claim 1, wherein the three primary colors are red, green, blue and the five primary colors are red, green, blue, yellow, cyan.

3. The graphene display according to claim 2, wherein the determination module is also configured to:
   according to the obtained grayscale values of the three primary colors to determine a color block of a target color point of any pixel in the color gamut, wherein the color gamut includes five color blocks corresponding to the five primary colors; and
   according to the color block of the target color point of the pixel in the color gamut, to determine the obtained grayscale values of the three dynamic sub-pixels of the pixel.

4. The graphene display according to claim 3, wherein the determination module is further configured to:
   by the obtained grayscale values Ri, Gi, Bi in red, green, and blue of the pixel to obtain a maximum value a=max (Ri, Gi, Bi) and a minimum value b=min (Ri, Gi, Bi) of the pixel after calculation;
   if b=Gi or a=b, it can be determined that the target color point of the pixel in the color gamut falls into a WRB block;
   if b=Ri and a≠Bi, it can be determined that the target color point of the pixel in the color gamut falls into a WGC block;
   if b=Ri or a=Bi, it can be determined that the target color point of the pixel in the color gamut falls into a WCB block;
   if b≠$R_1$ and a=$G_1$, it can be determined that the target color point of the pixel in the color gamut falls into a WYG block; and
   if b≠Ri and a≠Gi, it can be determined that the target color point of the pixel in the color gamut falls into a WRY block.

5. The graphene display according to claim 4, wherein the determination module is further configured to:
   when the target color point of the pixel in the color gamut falls into the WRB block, the adjusted grayscale values of the three dynamic sub-pixels of the pixel is determined to be Rgi=Ri, Ggi=Gi, Bgi=Bi;
   when the target color point of the pixel in the color gamut falls into the WGC block, the adjusted grayscale values of the three dynamic sub-pixels of the pixel is determined to be Rgi=Ri, Ggi=Gi-Bi, Cgi=Bi;
   when the target color point of the pixel in the color gamut falls into the WCB block, the adjusted grayscale values of the three dynamic sub-pixels of the pixel is determined to be Rgi=Ri, Cgi=Gi-Ri, Bgi=Bi;
   when the target color point of the pixel in the color gamut falls into the WYG block, the adjusted grayscale values of the three dynamic sub-pixels of the pixel is determined to be Ygi=Ri, Ggi=Gi-Ri, Bgi=Bi;
   when the target color point of the pixel in the color gamut falls into the WRY block, the adjusted grayscale values of the three dynamic sub-pixels of the pixel is determined to be Rgi=Ri-Gi, Ygi=Gi, Bgi=Bi;
   wherein, Rgi, Ggi, Bgi, Ygi, Cgi respected grayscale values in red, green, blue, yellow, cyan as the five primary colors such that the pixel uses the three dynamic sub-pixels thereof to display the adjusted grayscale values of the five primary colors in the color gamut.

6. The graphene display according to claim 4, wherein the driving apparatus further comprising a color gamut determination module to establish the five primary colors in the color gamut; and divided the color gamut into five color blocks of WRB, WGC, WCB, WYG and WRY.

7. A driving method for a graphene display, wherein each pixel of the graphene display being consisted of three dynamic sub-pixels, the driving method comprising;
obtaining grayscale values of three primary colors of each pixel to be input;
determining adjusted grayscale values of the three dynamic sub-pixels of each pixel according to the obtained grayscale values of the three primary colors of each pixel and a preset correspondence relationship of the obtained grayscale values of the three primary colors and color blocks determined by five primary colors in color gamut;
applying the driving voltages to the three dynamic sub-pixels respectively corresponding to the adjusted grayscale values of the three dynamic sub-pixels of each pixel such that each pixel uses the three dynamic sub-pixels thereof to display the adjusted grayscale values of the five primary colors in the color gamut.

8. The driving method according to claim 7, wherein the three primary colors are red, green, blue and the five primary colors are red, green, blue, yellow, cyan.

9. The driving method according to claim 8, wherein the determining adjusted grayscale values of the three dynamic sub-pixels of each pixel according to the obtained grayscale values of the three primary colors of each pixel and a preset correspondence relationship of the obtained grayscale values of the three primary colors and color blocks determined by five primary colors in color gamut, comprising:
according to the obtained grayscale values of the three primary colors to determine a color block of a target color point of any pixel in the color gamut, wherein the color gamut includes five color blocks corresponding to the five primary colors; and
according to the color block of the target color point of the pixel in the color gamut, to determine the obtained grayscale values of the three dynamic sub-pixels of the pixel.

10. The driving method according to claim 9, wherein according to the color block of the target color point of the pixel in the color gamut, to determine the obtained grayscale values of the three dynamic sub-pixels of the pixel, comprising:
by the obtained grayscale values Ri, Gi, Bi in red, green, and blue to obtain a maximum value a=max (Ri, Gi, Bi) and a minimum value b=min (Ri, Gi, Bi) of the pixel after calculation;
if b=Gi or a=b, it can be determined that the target color point of the pixel in the color gamut falls into a WRB block;
if b=Ri and a≠Bi, it can be determined that the target color point of the pixel in the color gamut falls into a WGC block;
if b=Ri or a=Bi, it can be determined that the target color point of the pixel in the color gamut falls into a WCB block;
if b≠Ri and a=Gi, it can be determined that the target color point of the pixel in the color gamut into a WYG block; and
if b≠Ri and a≠Gi, it can be determined that the target color point of the pixel in the color gamut falls into a WRY block.

11. The driving method according to claim 10, wherein according to the color block of the target color point of the pixel in the color gamut, to determine the adjusted grayscale values of the three dynamic sub-pixels of the pixel, comprising:
when the target color point of the pixel in the color gamut falls into the WRB block, the adjusted grayscale values of the three dynamic sub-pixels of the pixel is determined to be Rgi=Ri, Ggi=Gi, Bgi=Bi;
when the target color point of the pixel in the color gamut falls into the WGC block, the adjusted grayscale values of the three dynamic sub-pixels of the pixel is determined to be Rgi=Ri, Ggi=Gi−Bi, Cgi=Bi;
when the target color point of the pixel in the color gamut falls into the WCB block, the adjusted grayscale values of the three dynamic sub-pixels of the pixel is determined to be Rgi=Ri, Cgi=Gi−Ri, Bgi=Bi;
when the target color point of the pixel in the color gamut falls into the WYG block, the adjusted grayscale values of the three dynamic sub-pixels of the pixel is determined to be Ygi=Ri, Ggi=Gi−Ri, Bgi=Bi;
when the target color point of the pixel in the color gamut falls into the WRY block, the adjusted grayscale values of the three dynamic sub-pixels of the pixel is determined to be Rgi=Ri−Gi, Ygi=Gi, Bgi=Bi;
wherein, Rgi, Ggi, Bgi, Ygi, Cgi respected grayscale values in red, green, blue, yellow, cyan as the five primary colors such that the pixel uses the three dynamic sub-pixels thereof to display the adjusted grayscale values of the five primary colors in the color gamut.

12. The driving method according to claim 10, wherein the driving method further comprising establish the five primary colors in the color gamut; and divided the color gamut into five color blocks of WRB, WGC, WCB, WYG and WRY.

13. A driving apparatus for a graphene display, wherein the graphene display comprising a plurality of pixels distributed in array type and each of the pixels is consisted of three dynamic sub-pixels, and the driving apparatus comprising:
an obtaining module to obtaining grayscale values of three primary colors of each of the pixels to be input;
a determination module to determining adjusted grayscale values of the three dynamic sub-pixels of each of the pixels according to the obtained grayscale values of the three primary colors of each of the pixels and a preset correspondence relationship of the obtained grayscale values of the three primary colors and color blocks determined by five primary colors in color gamut;
a driving module to apply driving voltages to the three dynamic sub-pixels respectively corresponding to the adjusted grayscale values of the three dynamic sub-pixels of each of the pixels such that each of the pixels uses the three dynamic sub-pixels thereof to display the adjusted grayscale values of the five primary colors in the color gamut.

14. The driving apparatus according to claim 13, wherein the three primary colors are red, green, blue and the five primary colors are red, green, blue, yellow, cyan.

15. The driving apparatus according to claim 14, wherein the determination module is also configured to:
according to the obtained grayscale values of the three primary colors to determine a color block of a target color point of any pixel in the color gamut, wherein the color gamut includes five color blocks corresponding to the five primary colors; and according to the color block of the target color point of the pixel in the color gamut, to determine the obtained grayscale values of the three dynamic sub-pixels of the pixel.

16. The driving apparatus according to claim 15, wherein the determination module is further configured to:
by the obtained grayscale values Ri, Gi, Bi in red, green, and blue of the pixel to obtain a maximum value a=max (Ri, Gi, Bi) and a minimum value b=min (Ri, Gi, Bi) of the pixel after calculation;
if b=Gi or a=b, it can be determined that the target color point of the pixel in the color gamut falls into a WRB block;
if b=Ri and a≠Bi, it can be determined that the target color point of the pixel in the color gamut falls into a WGC block;
if b=Ri or a=Bi, it can be determined that the target color point of the pixel in the color gamut falls into a WCB block;
if b≠Ri and a=Gi, it can be determined that the target color point of the pixel in the color gamut falls into a WYG block; and
if b≠Ri and a≠Gi, it can be determined that the target color point of the pixel in the color gamut falls into a WRY block.

17. The driving apparatus according to claim 16, wherein the determination module is further configured to:
when the target color point of the pixel in the color gamut falls into the WRB block; the adjusted grayscale values of the three dynamic sub-pixels of the pixel is determined to be Rgi=Ri, Ggi=Gi, Bgi=Bi;
when the target color point of the pixel in the color gamut falls into the WGC block, the adjusted grayscale values of the three dynamic sub-pixels of the pixel is determined to be Rgi=Ri, Ggi=Gi−Bi, Cgi=Bi;
when the target color point of the pixel in the color gamut falls into the WCB block, the adjusted grayscale values of the three dynamic sub-pixels of the pixel is determined to be Rgi=Ri, Cgi=Gi−Ri, Bgi=Bi;
when the target color point of the pixel in the color gamut falls into the WYG block, the adjusted grayscale values of the three dynamic sub-pixels of the pixel is determined to be Ygi=Ri, Ggi=Gi−Ri, Bgi=Bi;
when the target color point of the pixel in the color gamut falls into the WRY block, the adjusted grayscale values of the three dynamic sub-pixels of the pixel is determined to be Rgi=Ri−Gi, Ygi=Gi, Bgi=Bi;
wherein, Rgi, Ggi, Bgi, Ygi, Cgi respected grayscale values in red, green, blue, yellow, cyan as the five primary colors such that the pixel uses the three dynamic sub-pixels thereof to display the adjusted grayscale values of the five primary colors in the color gamut.

18. The driving apparatus according to claim 16, wherein the driving apparatus further comprising a color gamut determination module to establish the five primary colors in the color gamut; and divided the color gamut into five color blocks of WRB, WGC, WCB, WYG and WRY.

* * * * *